US009911867B2

(12) United States Patent
Tsai et al.

(10) Patent No.: US 9,911,867 B2
(45) Date of Patent: Mar. 6, 2018

(54) FIN-BASED NONVOLATILE MEMORY STRUCTURES, INTEGRATED CIRCUITS WITH SUCH STRUCTURES, AND METHODS FOR FABRICATING SAME

(71) Applicant: Globalfoundries Singapore Pte. Ltd., Singapore (SG)

(72) Inventors: Ming-Tsang Tsai, Singapore (SG); Khee Yong Lim, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/200,347

(22) Filed: Jul. 1, 2016

(65) Prior Publication Data

US 2018/0006158 A1    Jan. 4, 2018

(51) Int. Cl.
  *H01L 29/788*   (2006.01)
  *H01L 29/423*   (2006.01)
  *H01L 29/78*    (2006.01)
  *H01L 29/06*    (2006.01)
  *H01L 29/66*    (2006.01)

(52) U.S. Cl.
  CPC ...... *H01L 29/7887* (2013.01); *H01L 29/0653* (2013.01); *H01L 29/42328* (2013.01); *H01L 29/66795* (2013.01); *H01L 29/66825* (2013.01); *H01L 29/7851* (2013.01)

(58) Field of Classification Search
  CPC ................. C09K 11/025; C09K 11/06; C09K 2211/1007; H01L 33/62; H01L 51/56
  USPC .................................................. 257/315, 316
  See application file for complete search history.

(56) References Cited

U.S. PATENT DOCUMENTS

| 7,091,551 | B1 | 8/2006 | Anderson et al. |
| 7,811,889 | B2 | 10/2010 | Trivedi et al. |
| 2005/0073005 | A1 | 4/2005 | Nowak et al. |
| 2005/0104130 | A1 | 5/2005 | Nowak et al. |
| 2007/0076477 | A1 | 4/2007 | Hwang et al. |
| 2009/0108351 | A1 | 4/2009 | Yang et al. |

(Continued)

OTHER PUBLICATIONS

Padilla et al., "Dual-Bit Gate-Sidewall Storage FinFET NVM and New Method of Charge Detection", IEEE Electron Device Letters, Jun. 2007, pp. 502-505, vol. 28, No. 6.

(Continued)

*Primary Examiner* — Andy Huynh
(74) *Attorney, Agent, or Firm* — Lorenz & Kopf, LLP

(57) ABSTRACT

Integrated circuits, nonvolatile memory (NVM) structures, and methods for fabricating integrated circuits with NVM structures are provided. An exemplary integrated circuit includes a substrate and a dual-bit NVM structure overlying the substrate. The dual-bit NVM structure includes primary, first adjacent and second adjacent fin structures laterally extending in parallel over the substrate. The primary fin structure includes source, channel and drain regions. Each adjacent fin structure includes a program/erase gate. The dual-bit NVM structure further includes a first floating gate located between the channel region of the primary fin structure and the first adjacent fin structure and a second floating gate located between the channel region of the primary fin structure and the second adjacent fin structure. Also, the dual-bit NVM structure includes a control gate adjacent the primary fin structure.

20 Claims, 20 Drawing Sheets

(56) References Cited

U.S. PATENT DOCUMENTS

2015/0035039 A1* 2/2015 Li .................. H01L 21/845
 257/316
2015/0187784 A1* 7/2015 Tan ............... H01L 27/11551
 257/321

OTHER PUBLICATIONS

Padilla et all., "Dual-bit SONOS FinFET Non-Volatile Memory Cell and New Method of Charge Detection", 2007, 2 pages.

* cited by examiner

FIN-BASED NONVOLATILE MEMORY STRUCTURES, INTEGRATED CIRCUITS WITH SUCH STRUCTURES, AND METHODS FOR FABRICATING SAME

TECHNICAL FIELD

The present disclosure generally relates to integrated circuits and methods for fabricating integrated circuits, and more particularly relates to integrated circuits having fin-based nonvolatile memory (NVM) structures, such as dual-bit NVM structures.

BACKGROUND

As is well known by those skilled in the art, a continuing goal in manufacturing and production of memory devices is increased storage in the minimum area or least amount of silicon. Flash memory is programmable, erasable and non-volatile. The basic flash memory cell is a planar NMOS transistor that has been modified with a "floating" gate. A conventional flash memory cell is programmed by applying a high voltage to the control gate or the word line and a high voltage to the drain by way of the bit line. These voltages excite the electrons such that they push through the thin oxide layer and are trapped on the floating gate. Consequently, the gate carries a negative charge. If the negative charge on the floating gate is above a selected threshold level, the bit stored in the cell is defined as a "zero."

A flash memory cell programmed with a "zero" may be erased by applying a high voltage to the gate and leaving the drain or bit line open or floating. Thus, the excess electrons that were trapped on the floating gate now move to the gate so that the floating gate is again neutral, which is defined as a "one". To "read" the cell, an operation voltage is applied to the gate. If the transistor is turned on, its drain output is a high current and is defined as a "one". If the transistor is not on, its drain is a low current, which is defined as "zero." Thus, the floating gate planar NMOS transistor provides a high-speed non-volatile memory cell.

As the demand increases for larger and larger non-volatile high-speed memories, the typical answer has been to aggressively decrease the geometry or size of a memory chip and simply pack more memory cells in the same area. However, demand and need is increasing faster than can be accommodated by scaling or decreased geometry. Consequently, there have now been developed dual-bit flash cells that can provide two data bits per cell and effectively double the amount of storage in an array. Flash memory cells that can store two bits do so by using four different precise voltages to represent the state of the two bits. For such flash memory cells, the manufacturing process has little margin for variance to form floating gates that can be charged to precise voltage settings. Furthermore, the circuitry for providing the necessary word line, bit line and gate voltages to achieve the necessary threshold electron charges and resulting voltages is also significantly more complicated.

Accordingly, it is desirable to provide a nonvolatile memory cell with an improved structure, such as a dual-bit NVM cell. In addition, it is desirable to provide improved methods for fabricating integrated circuits including non-volatile memory structures. Furthermore, other desirable features and characteristics will become apparent from the subsequent detailed description and the appended claims, taken in conjunction with the accompanying drawings and the foregoing technical field and background.

BRIEF SUMMARY

Integrated circuits, NVM structures, and methods for fabricating integrated circuits with NVM structures are provided. An exemplary integrated circuit includes a substrate and a dual-bit NVM structure overlying the substrate. The dual-bit NVM structure includes a primary fin structure, a first adjacent fin structure and a second adjacent fin structure laterally extending in parallel over the substrate. The primary fin structure includes a source region, a channel region, and a drain region. The first adjacent fin structure includes a first program/erase gate. The second adjacent fin structure includes a second program/erase gate. The dual-bit NVM structure further includes a first floating gate located between the channel region of the primary fin structure and the first adjacent fin structure and a second floating gate located between the channel region of the primary fin structure and the second adjacent fin structure. Also, the dual-bit NVM structure includes a control gate adjacent the primary fin structure.

In another embodiment, an NVM structure is provided and includes a primary fin structure having a first side surface and a second side surface, an adjacent fin structure parallel to the primary fin structure and adjacent the first side surface. The NVM structure includes a first junction region and a second junction region in the primary fin structure. The NVM structure includes a first channel region at the first side surface between the first junction region and the second junction region. Also, the NVM structure includes a third junction region in the adjacent fin structure. Further, the NVM structure includes a floating gate adjacent the first channel region. The NVM structure includes a control gate adjacent the floating gate.

In accordance with another embodiment, a method for fabricating an integrated circuit with a dual-bit NVM structure is provided. The method includes forming a primary fin structure, a first adjacent fin structure and a second adjacent fin structure laterally extending in parallel. The method includes selectively doping the primary fin structure, the first adjacent fin structure and the second adjacent fin structure to form a source region, a channel region, a drain region, a first program/erase gate, and a second program/erase gate. Further, the method includes forming a first floating gate and a second floating gate. The first floating gate is located between the primary fin structure and the first adjacent fin structure and the second floating gate is located between the primary fin structure and the second adjacent fin structure. The method also includes forming a control gate adjacent the primary fin structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Embodiments of integrated circuits including fin-based nonvolatile memory structures and methods for fabricating fin-based nonvolatile memory structures will hereinafter be described in conjunction with the following drawing figures, wherein like numerals denote like elements, and wherein:

FIGS. 25-54 illustrate processing for forming the fin-based dual-bit nonvolatile memory structures of FIG. 4, 11 or 18 in accordance with embodiments herein; wherein:

FIGS. 25-35 are cross-section views of the fin-based dual-bit nonvolatile memory structure of FIGS. 4, 11 and/or 18, taken along lines 9-9 and/or 23-23, as indicated, in accordance with embodiments herein;

FIG. 36 is an overhead schematic of the structure of FIG. 35 during further processing in accordance with an embodiment herein;

FIGS. 37-38 are cross-section views of the structure of FIG. 36 taken along line 37-37 in FIG. 36 during further processing in accordance with an embodiment herein;

FIG. 39 is a cross-section view of the structure of FIG. 38 in a cross-section view similar to that of FIG. 35 during further processing in accordance with an embodiment herein;

FIGS. 40-43 are cross-section views of the structure of FIG. 38 along a line such as line 7-7 in FIG. 4 during further processing in accordance with an embodiment herein;

FIG. 44 is a cross-section view of the structure of FIG. 38 in a cross-section view similar to that of FIG. 35 during further processing in accordance with an embodiment herein;

FIGS. 45-48 are cross-section views of the structure of FIG. 38 along a line such as line 21-21 in FIG. 18 during further processing in accordance with an embodiment herein;

FIG. 49 is an overhead schematic of the structure of FIG. 43 during further processing in accordance with an embodiment herein;

FIGS. 50-51 are cross-section views of the structure of FIG. 49 taken along line 50-50 during further processing in accordance with an embodiment herein;

FIG. 52 is an overhead schematic of the structure of FIG. 48 during further processing in accordance with an embodiment herein; and FIGS. 53-54 are cross-section views of the structure of FIG. 52 taken along line 53-53 during further processing in accordance with an embodiment herein.

DETAILED DESCRIPTION

Figure 1:
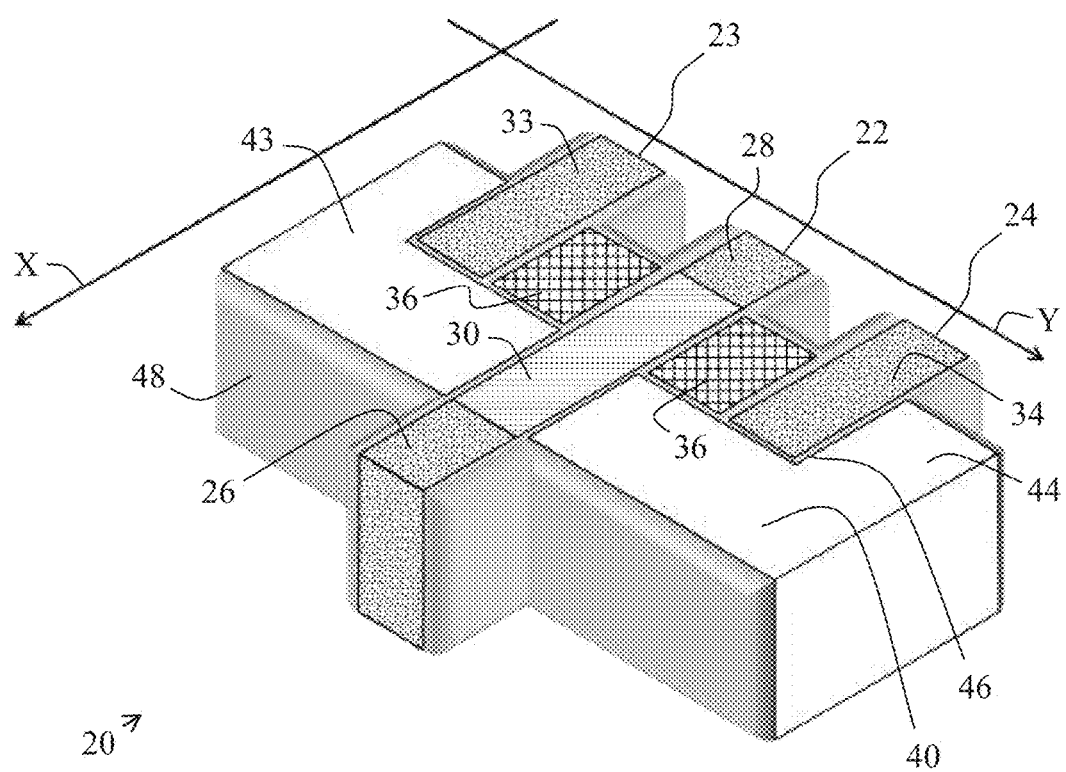
FIG. 1 provides a perspective view of an embodiment of a fin-based dual-bit nonvolatile memory structure.

The following detailed description is merely exemplary in nature and is not intended to limit the integrated circuits, NVM structures, or methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits including dual-bit NVM structures formed in and around fin structures and methods for fabricating fin-based dual-bit NVM structures are provided. Generally, the following embodiments relate to the formation of a dual-bit NVM structure using three parallel fins. Adjacent dual-bit NVM structures may share a fin, such that two dual-bit NVM structures may be formed using five parallel fins. Methods described herein are compatible with fin-based field effect transistor (finFET) logic processing. Processing herein provides for self-alignment of floating gates with fins. Further, each dual-bit NVM structure described herein is provided with two program/erase gates through which a program probe or erase probe may be connected. Using separate program probes and erase probes enhances program/erase endurance of an NVM structure.

While the figures and description illustrate formation of a dual-bit NVM cell, it is understood that single bit NVM cells may be formed from two parallel fins, one floating gate, one program/erase gate, and one control gate. Such an NVM cell may or may not share a fin with an adjacent NVM cell.

The Figures illustrate sequentially processing in methods for fabricating an integrated circuit including a dual-bit NVM structure. Various processes in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components in the integrated circuits.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly. As used herein, "adjacent" is not spatially relative but refers to elements that are next to one another at a common height (in the context of a reference substrate using the orientation of the figures) and does not include elements that lie over or beneath another element but not at the same common height. As used herein, "between" refers to an element that is directly between a first reference element and a second reference element such that a straight line from the first reference element to the second reference element passes through the element.

Turning now to FIG. 1, an exemplary dual-bit NVM structure 20 is illustrated and generally described. As shown, the dual-bit NVM structure 20 is formed on three fin structures 22, 23 and 24 extending in parallel in the X-direction and spaced from one another in the Y direction. In the illustrated embodiment, first adjacent fin structure 23 and second adjacent fin structure 24 are shorter than primary fin structure 22. In other embodiments, first adjacent fin structure 23 and second adjacent fin structure 24 may be as long as or longer than primary fin structure 22. A junction region 26, such as a drain region, is formed at one end of the primary fin structure 22 and a junction region 28, such as a source region, is formed at the opposite end of the primary fin structure 22. A channel region 30 is formed between the junction region 26 and the junction region 28 in the primary fin structure 22.

As shown, a program/erase gate junction region 33 is formed in adjacent fin structure 23 and a program/erase gate junction region 34 is formed in adjacent fin structure 24. Each region 33 and 34 may be independently electrically connected to both a program probe and to an erase probe. Also, a floating gate 36 is formed between the channel region 30 of the primary fin structure 22 and each program/erase gate junction region 33 and 34. Further, a control gate 40 is formed adjacent to each side of the channel region 30 in the primary fin structure 22. In the embodiment of FIG. 1, the control gate 40 also lies adjacent, in the Y direction, to each program/erase gate junction region 33 and 34. The control gate 40 may be formed as a single gate that extends over the primary fin structure 22, or as separated gate portions 43 and 44 that are not interconnected over the primary fin structure 22.

FIG. 1 illustrates that the various components may be physically separated from one another by dielectric layers 46. Further, spacers 48 may be formed around the dual-bit NVM structure 20.

Figure 2:
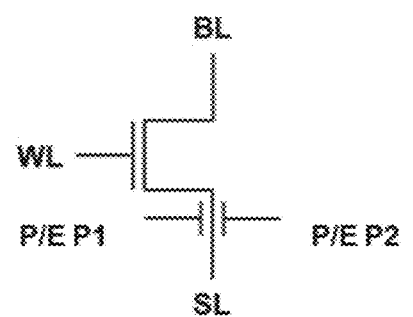
FIG. 2 is a circuit diagram of the dual-bit nonvolatile memory cell of FIG. 1.
Figure 3:
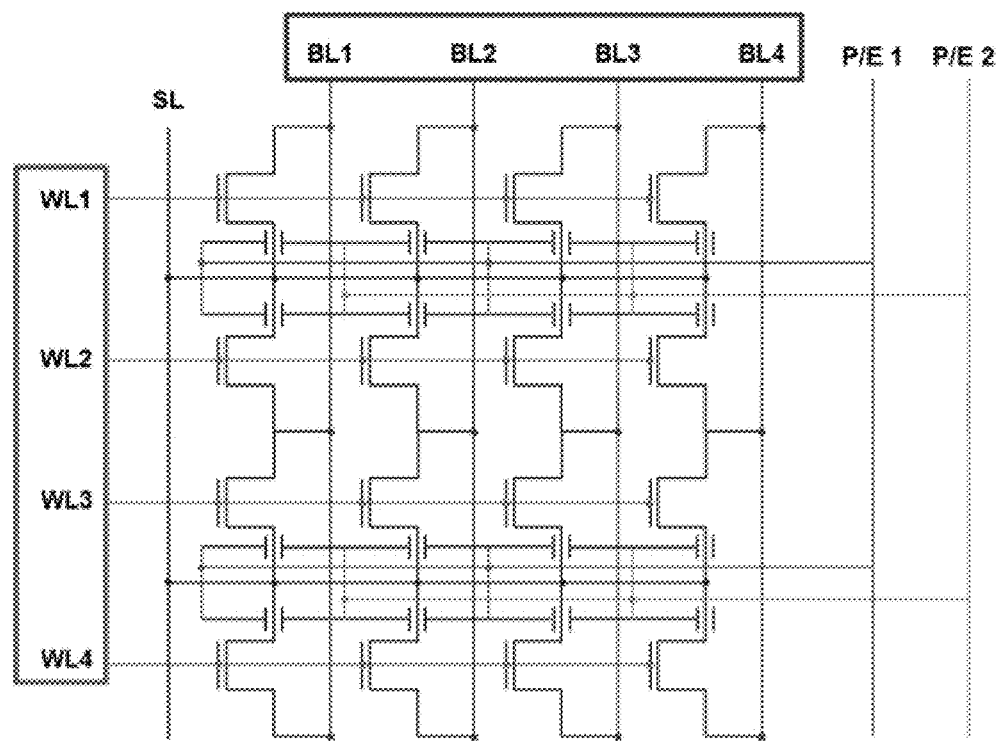
FIG. 3 is a circuit diagram illustrating connections of a plurality of dual-bit memory cells of FIG. 2, according to an embodiment herein.

FIG. 2 illustrates an exemplary circuit for the dual-bit NVM structure 20 of FIG. 1 and FIG. 3 illustrates circuitry for a plurality of dual-bit NVM structures 20. Cross-referencing FIGS. 1-3, it may be seen that a bit line (BL) may be connected to the junction region 26 and a source line (SL) may be connected to the junction region 28. A word line (WL) may be connected to control gate 40. Further, a program and/or erase probe (P/E P1) may be connected to program/erase gate junction region 33 and a program and/or erase probe (P/E P2) may be connected to program/erase gate junction region 34. As a result, program, erase and read operations of the dual-bit NVM structure 20 may be performed according to TABLE 1, wherein Vdd refers to the positive supply voltage, low voltage (LV) refers to threshold voltage, and high voltage (HV) refers to voltages of oxide breakdown limitation.

TABLE 1

|  | Type | BL | WL | P/E P1 | P/E P2 | SL |
|---|---|---|---|---|---|---|
| Program | 00 | Vdd | LV | HV | HV | 0 |
|  | 10 | Vdd | LV | 0 | HV | 0 |
|  | 01 | Vdd | LV | HV | 0 | 0 |
| Erase | 00 | 0 | 0 | HV | HV | 0 |
|  | 10 | 0 | 0 | 0 | HV | 0 |
|  | 01 | 0 | 0 | HV | 0 | 0 |
| Read 1 |  | Vdd | Vdd | Vdd | 0 | 0 |
| Read 2 |  | Vdd | Vdd | 0 | Vdd | 0 |

With the above understanding of the general structure and operation of a dual-bit NVM structure 20, specific embodiments may be considered. For example, a first embodiment is illustrated in FIGS. 4-10, a second embodiment is illustrated in FIGS. 11-17, and a third embodiment is illustrated in FIGS. 18-25.

Figure 4:
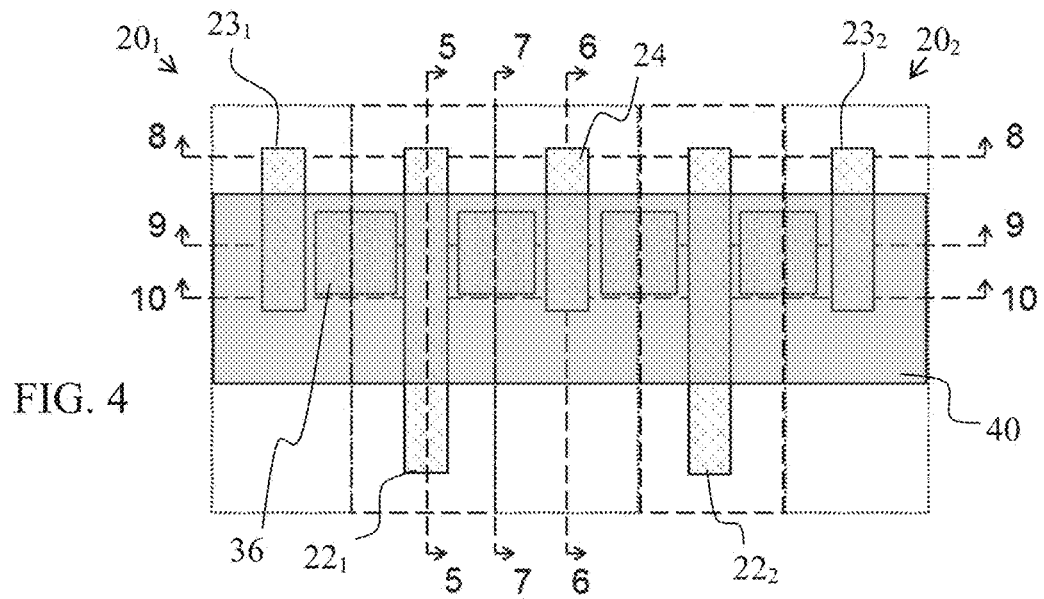
FIG. 4 is an overhead schematic of an embodiment of the fin-based dual-bit nonvolatile memory structure of FIG. 1.

FIG. 4 provides an overhead schematic of a first dual-bit NVM structure $20_1$ and second dual-bit NVM structure $20_2$ formed side-by-side over a substrate. In the embodiment of FIG. 4, the first dual-bit NVM structure $20_1$ and second dual-bit NVM structure $20_2$ share adjacent fin structure 24. Control gate 40 is formed by a common control gate layer that extends over fin structures $23_1$, $22_1$, 24, $22_2$, and $23_2$.

Figure 5:
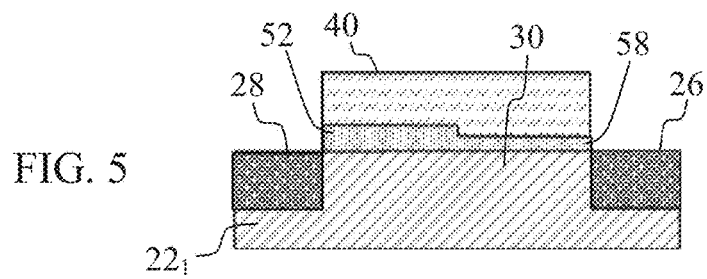
FIGS. 5-7 are cross-section views of the fin-based dual-bit nonvolatile memory structure of FIG. 4, taken along lines 5-5, 6-6, and 7-7, respectively.

FIG. 5 is a cross-section view taken along line 5-5 in FIG. 4. As shown, primary fin structure $22_1$ is formed with junction regions 26 and 28 that define a channel region 30 in the fin structure $22_1$. In the embodiment of FIGS. 4-10, the primary fin structure $22_1$, including channel region 30 is P doped to form a P well, while the junction regions 26 and 28 are heavily N doped (N+ doped). As used herein, "heavily" refers to doped layers having more than one dopant atom per one-hundred thousand atoms of semiconductor (such as silicon).

As shown, dielectric layers 52 and 58 are formed over the channel region 30 and the control gate 40 is formed over the dielectric layers 52 and 58. Exemplary dielectric layers 52 and 58 are silicon oxide, though any suitable dielectric material may be used. An exemplary control gate 40 is formed from polycrystalline silicon ("polysilicon"), though any suitable gate material may be used. In the embodiment of FIG. 5, the junction regions 26 and 28 are aligned with the control gate 40.

Figure 6:
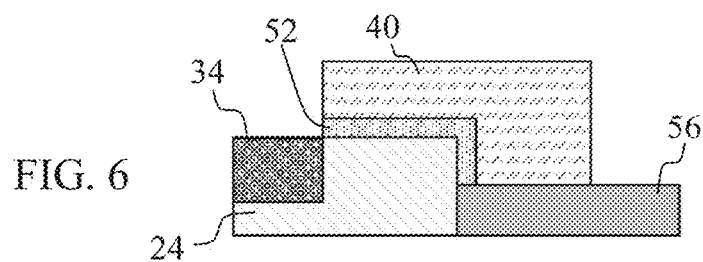

FIG. 6 is a cross-section view taken along line 6-6 in FIG. 4. In the embodiment of FIGS. 4-10, adjacent fin structure 24 is N doped to serve as a program/erase gate. As shown, program/erase gate junction region 34 is formed in the adjacent fin structure 24. Further, program/erase gate junction region 34 is heavily N doped (N+). An isolation region 56 is formed adjacent to the adjacent fin structure 24. As shown, dielectric layer 52 extends over the top surface and sidewall of adjacent fin structure 24 and adjacent the control gate 40 and abuts the isolation region 56. Further, the control gate 40 lies directly over both the adjacent fin structure 24 and the isolation region 56. In the embodiment of FIG. 6, the junction region 34 is aligned with the control gate 40.

Figure 7:
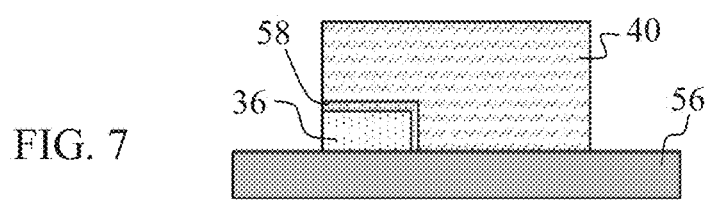

FIG. 7 is a cross-section view taken along line 7-7 in FIG. 4. As shown, floating gate 36 is formed over isolation region 56. An exemplary floating gate 36 is polysilicon, such as in situ doped polysilicon. An exemplary floating gate 36 is formed from heavily N doped (N+) polysilicon. Also, dielectric layer 58 is formed over the floating gate 36. As shown, the control gate 40 lies directly over the floating gate 36 and the isolation region 56.

Figure 8:
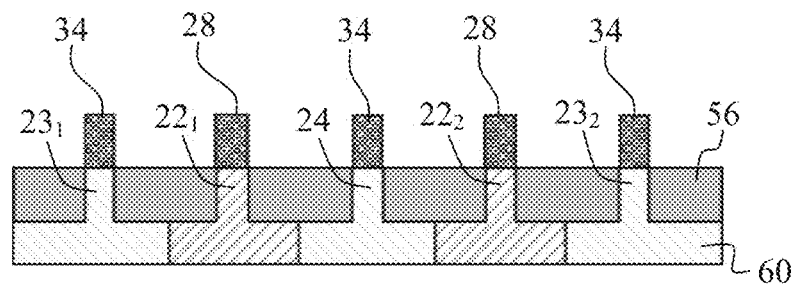
FIGS. 8-10 are cross-section views of the fin-based dual-bit nonvolatile memory structure of FIG. 4, taken along lines 8-8, 9-9, and 10-10, respectively.

In FIG. 8, a cross-section view taken along line 8-8 in FIG. 4 illustrates the formation of fin structures $22_1$, $23_1$, 24, $22_2$, and $23_2$ from an underlying substrate 60. An exemplary substrate 60 is a semiconductor material, such as silicon. Isolation region 56 covers the substrate 60 between fin structures. As described above, in the embodiment of FIGS. 4-10, the primary fin structures $22_1$ and $22_2$ are P doped to form P wells, and the adjacent fin structures $23_1$, 24, and $23_2$ are N doped to serve as a program/erase gate N wells. As shown, the portions of the substrate 60 underlying the fin structures are similarly doped. Further, the portions of the fin structures extending above the isolation region 56 are heavily N doped (N+) junction regions 28 and 34.

Figure 9:
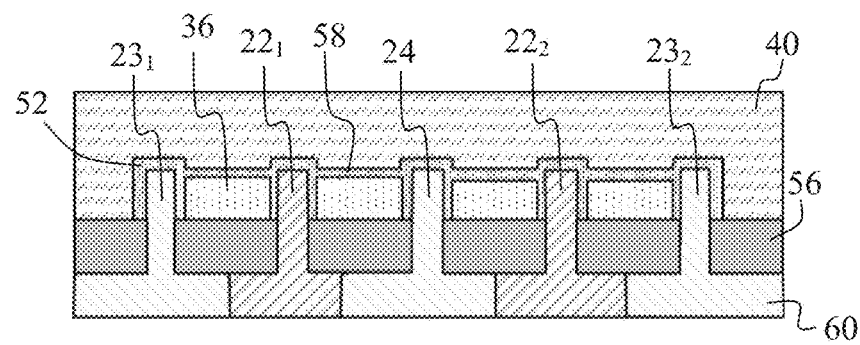

FIG. 9 illustrates the cross-section view taken along line 9-9 in FIG. 4. FIG. 9 illustrates clearly how each floating gate 36 is self-aligned with fin structures $22_1$, $23_1$, 24, $22_2$, or $23_2$. As shown, dielectric layer 52 covers each fin structure and dielectric layer 58 covers each floating gate 36. In the exemplary embodiment of FIGS. 4-10, the control gate 40 is formed by a common control gate layer that extends over fin structures $22_1$, $23_1$, 24, $22_2$, and $23_2$ and floating gates 36.

Figure 10:
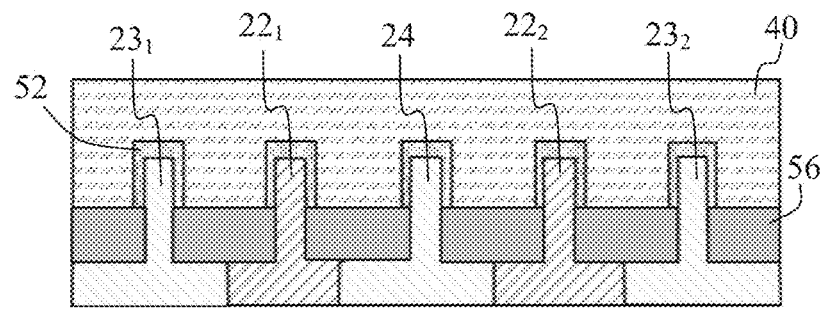

In FIG. 10, a cross-section view taken along line 10-10 in FIG. 4. As shown, line 10-10 crosses through fin structures $22_1$, $23_1$, 24, $22_2$, and $23_2$, but not through floating gates 36. Rather, FIG. 10 shows that the control gate 40 is in connect with the isolation region 56 between fin structures along the illustrated cross-section.

Figure 11:
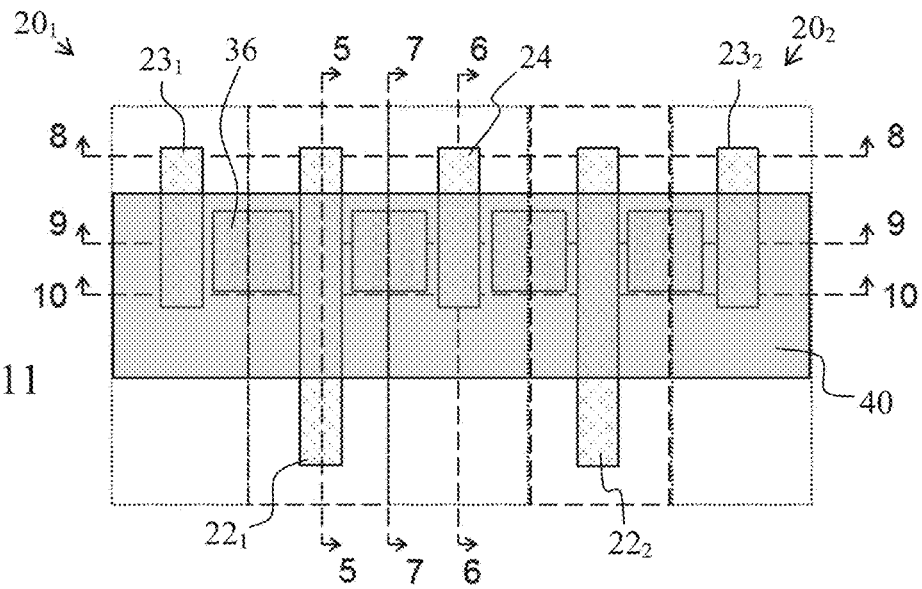
FIG. 11 is an overhead schematic of another embodiment of the fin-based dual-bit nonvolatile memory structure of FIG. 1.
Figure 12:
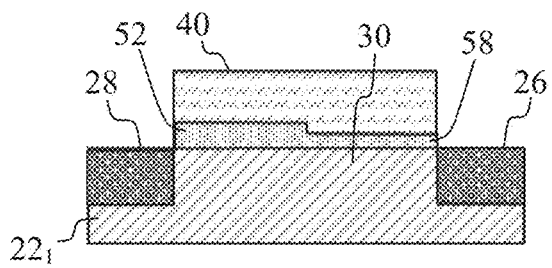
FIGS. 12-14 are cross-section views of the fin-based dual-bit nonvolatile memory structure of FIG. 11, taken along lines taken along lines 5-5, 6-6, and 7-7, respectively, respectively.
Figure 13:
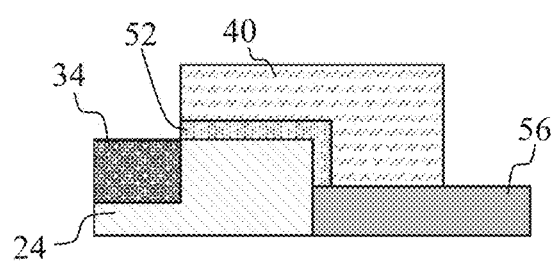
Figure 14:
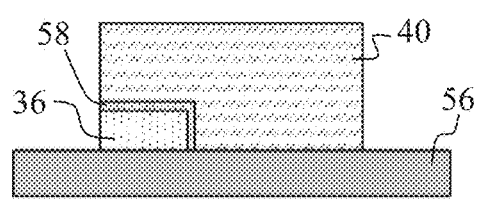

FIGS. 11-17 illustrate an alternate embodiment of a first dual-bit NVM structure $20_1$ and second dual-bit NVM structure $20_2$. Structurally, the elements of the embodiment of FIGS. 11-17 are identical to the elements of the embodiment of FIGS. 4-10. However, various elements may be doped differently between the two embodiments. FIG. 11 is an overhead schematic of a first dual-bit NVM structure $20_1$ and second dual-bit NVM structure $20_2$ identical to FIG. 4, but for dopant types of certain elements. FIG. 12 is a cross-section view taken along line 5-5 in FIG. 11. The elements of FIG. 12 are identical to the elements of FIG. 5. FIG. 14 is a cross-section view taken along line 7-7 in FIG. 11. The elements of FIG. 14 are identical to the elements of FIG. 7.

FIG. 13 is a cross-section view taken along line 6-6 in FIG. 11. Unlike the embodiment of FIG. 6, the adjacent fin structure 24 is not N doped. Rather, the adjacent fin structure 24 in the embodiment of FIGS. 11-17 is P doped to form a P well.

Figure 15:
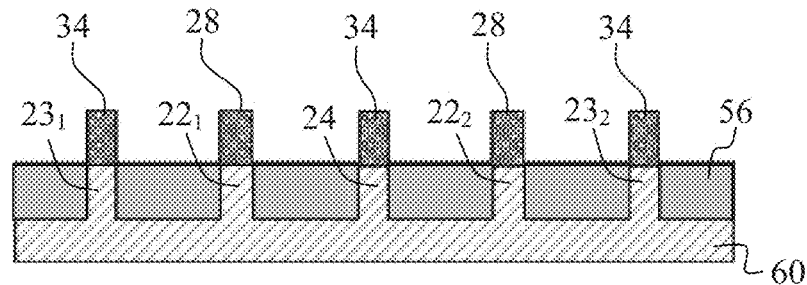
FIGS. 15-17 are cross-section views of the fin-based dual-bit nonvolatile memory structure of FIG. 11, taken along lines 8-8, 9-9, and 10-10, respectively.

FIG. 15 is a cross-section view taken along line 8-8 in FIG. 11. In FIG. 15, substrate 60 and each fin structure $22_1$, $23_1$, 24, $22_2$, and $23_2$ are P doped to form P wells, unlike the embodiment of FIG. 8.

Figure 16:
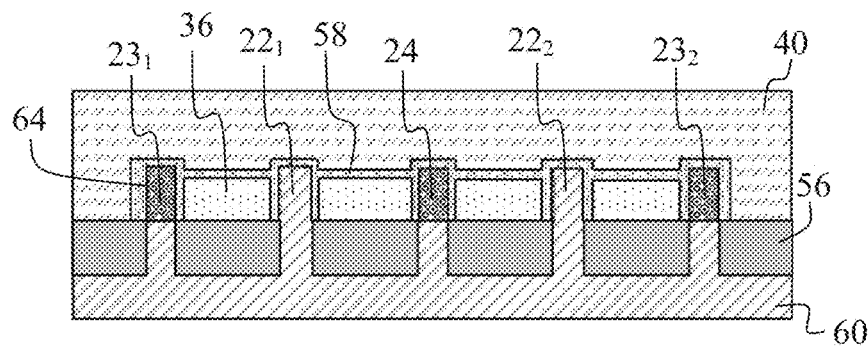
Figure 17:
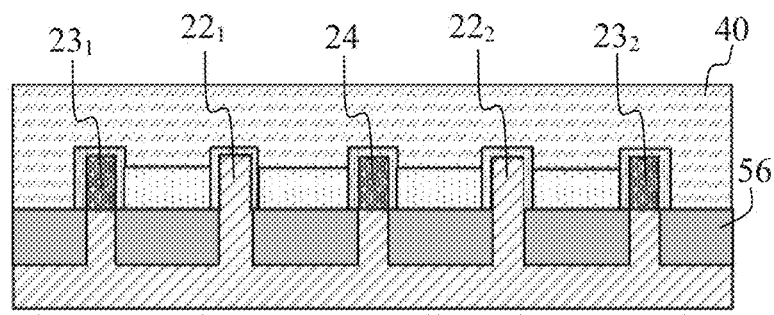

FIG. 16 is a cross-section view taken along line 9-9 in in FIG. 11 and FIG. 17 is a cross-section view taken along line 10-10 in FIG. 11. In FIGS. 16 and 17, the portions of adjacent fin structures $23_1$, 24, and $23_2$ that extend above isolation region 56 are heavily N doped (N+) to form junction regions 64 to reduce resistance between the control gate 40 and the P doped fin structures $23_1$, 24, and $23_2$ of the embodiment of FIGS. 11-17.

Figure 18:
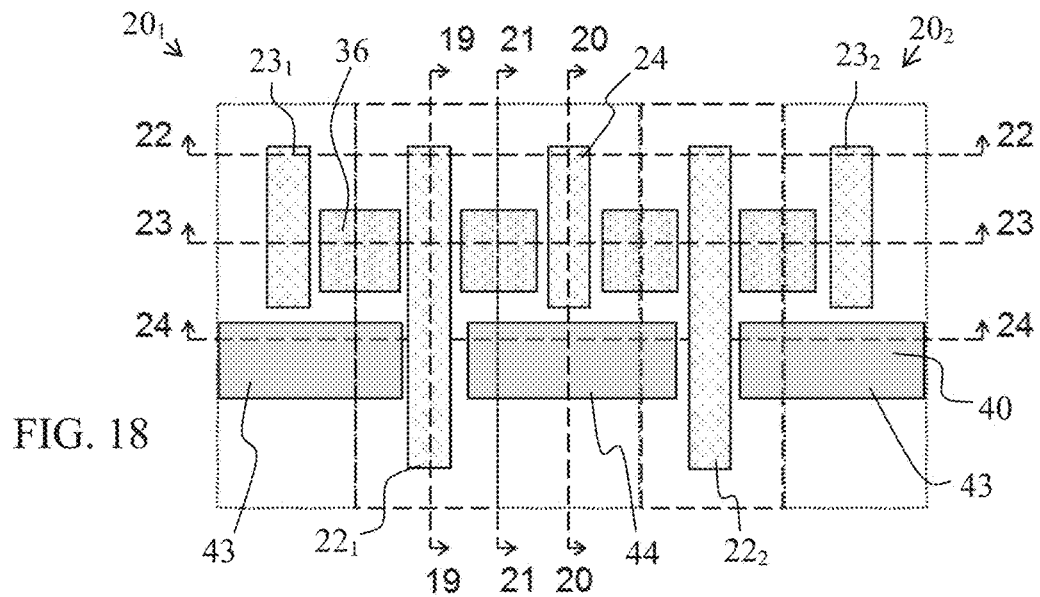
FIG. 18 is an overhead schematic of another embodiment of the fin-based dual-bit nonvolatile memory structure of FIG. 1.

FIGS. 18-24 illustrate another embodiment of a first dual-bit NVM structure $20_1$ and second dual-bit NVM structure $20_2$ formed over a substrate. The embodiment of FIGS. 18-24 includes a structural difference from the embodiments of FIGS. 4-10 and 11-17. Specifically, as shown in FIG. 18, which is an overhead schematic, control gate 40 includes discrete portions 43 and 44 that are not connected. Thus, the control gate 40 does not extend over the primary fin structures $22_1$ and $22_2$, as in the embodiments of FIGS. 4-10 and 11-17.

Figure 19:
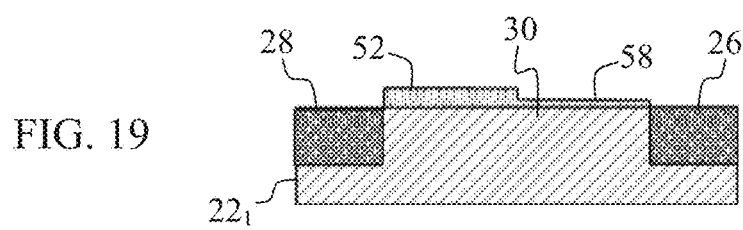
FIGS. 19-21 are cross-section views of the fin-based dual-bit nonvolatile memory structure of FIG. 18, taken along lines taken along lines 19-19, 20-20, and 21-21, respectively, respectively.

FIG. 19 is a cross-section view taken along line 19-19 in FIG. 18. As shown, primary fin structure $22_1$ is formed with junction regions 26 and 28 that define a channel region 30 in the fin structure $22_1$. In the embodiment of FIGS. 18-24, the primary fin structure $22_1$, including channel region 30 is P doped to form a P well, while the junction regions 26 and 28 are heavily N doped (N+ doped). As shown, dielectric layers 52 and 58 are formed over the channel region 30. Unlike prior embodiment, no portion of the control gate lies over the primary fin structure $22_1$.

Figure 20:
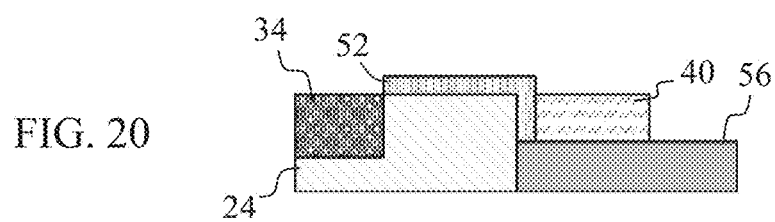

FIG. 20 illustrates a cross-section view taken along line 20-20 in FIG. 18. In the embodiment of FIGS. 18-24, adjacent fin structure 24 is N doped to serve as a program/erase gate. As shown, program/erase gate junction region 34 is formed in the adjacent fin structure 24. Further, program/erase gate junction region 34 is heavily N doped (N+). An isolation region 56 is formed adjacent to the adjacent fin structure 24. As shown, dielectric layer 52 extends over the top surface and along the sidewall of the fin structure 24 and adjacent control gate 40 and abuts the isolation region 56. Further, the control gate 40 lies over the isolation region 56 adjacent to but not over the adjacent fin structure 24.

Figure 21:
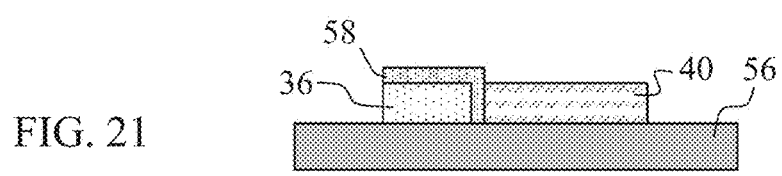

FIG. 21 is a cross-section view taken along line 21-21 in FIG. 18. As shown, floating gate 36 is formed over isolation region 56. An exemplary floating gate 36 is polysilicon, such as in situ doped polysilicon. An exemplary floating gate 36 is formed from heavily N doped (N+) polysilicon. Also, dielectric layer 58 is formed over the floating gate 36. An exemplary dielectric layer 58 is silicon oxide. As shown, the control gate 40 lies directly over the isolation region 56 adjacent to but not over the floating gate 36.

Figure 22:
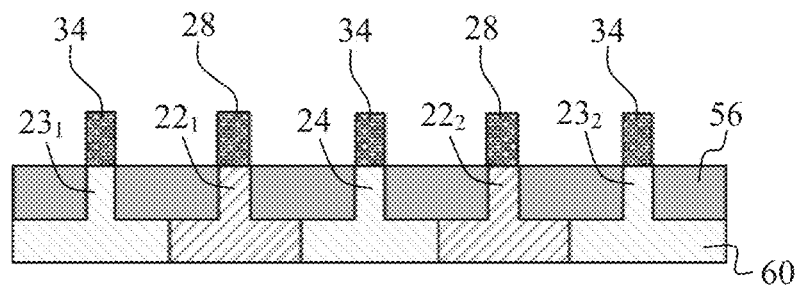
FIGS. 22-24 are cross-section views of the fin-based dual-bit nonvolatile memory structure of FIG. 18, taken along lines 22-22, 23-23, and 24-24, respectively.
Figure 23:
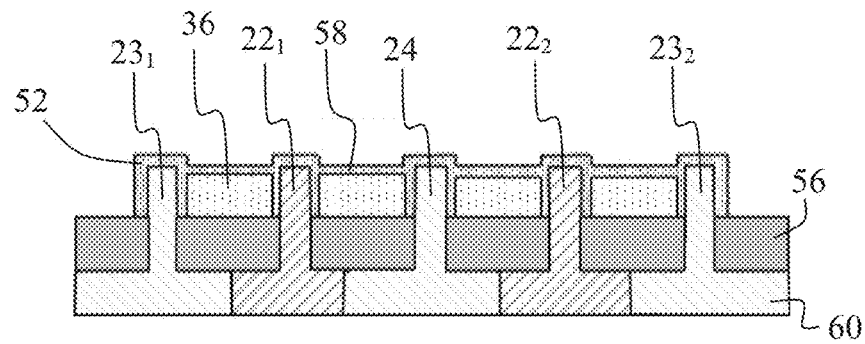

In FIG. 22, a cross-section view taken along line 22-22 in FIG. 18 illustrates the formation of fin structures $22_1$, $23_1$, 24, $22_2$, and $23_2$ from an underlying substrate 60 and includes elements identical to the elements of FIG. 8. FIG. 23 illustrates the cross-section view taken along line 23-23 in FIG. 18. FIG. 23 is identical to FIG. 9 save for the absence of control gate 40.

Figure 24:
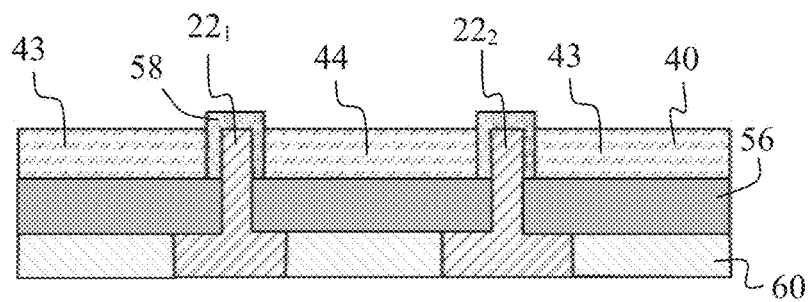

FIG. 24 is a cross-section view taken along line 24-24 in FIG. 18 and illustrates that the control gate portions 43 and 44 extend between primary fin structures $22_1$ and $22_2$ and over the isolation region 56, but do not extend over primary fin structures $22_1$ and $22_2$.

While the embodiment of FIGS. 18-24 including a control gate 40 having discrete portions 43 and 44 is illustrated with the same doping arrangement as the embodiment of FIGS. 4-10, it is contemplated that the embodiment of FIGS. 18-24 include the doping arrangement of FIGS. 11-17.

With the above understanding of embodiments of fin-based dual-bit NVM structures, FIGS. 25-54 illustrate processing for forming a fin-based dual-bit NVM structure. It is noted that FIGS. 4-24 illustrate two side-by-side dual-bit NVM structures, the processing in FIGS. 25-54 illustrates formation of a single dual-bit NVM structure. In practice, a large number of dual-bit NVM structures may be formed side-by-side over a substrate.

Figure 25:
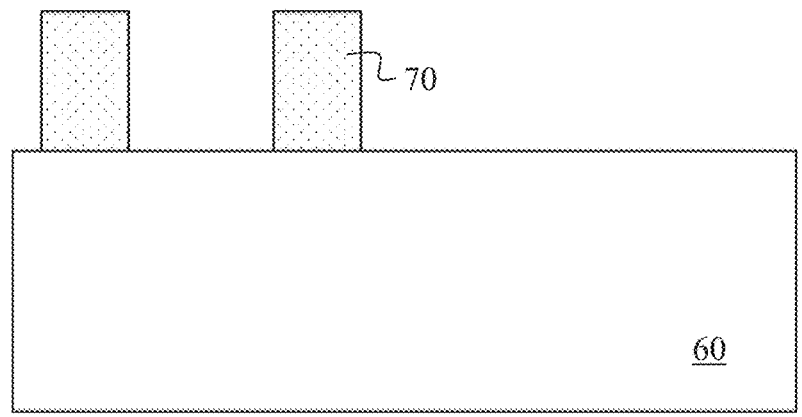

In FIG. 25, substrate 60 is provided. An exemplary substrate 60 is a semiconductor material. Herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate 60 may include a compound semiconductor such as silicon carbide, silicon germanide, gallium arsenide, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated.

As shown, a sacrificial material is deposited and patterned to form mask elements 70. In an exemplary embodiment, the sacrificial material is polysilicon. The sacrificial material may be etched to from mask elements 70 during active region definition processing of NVM or logic structures over substrate 60.

Figure 26:
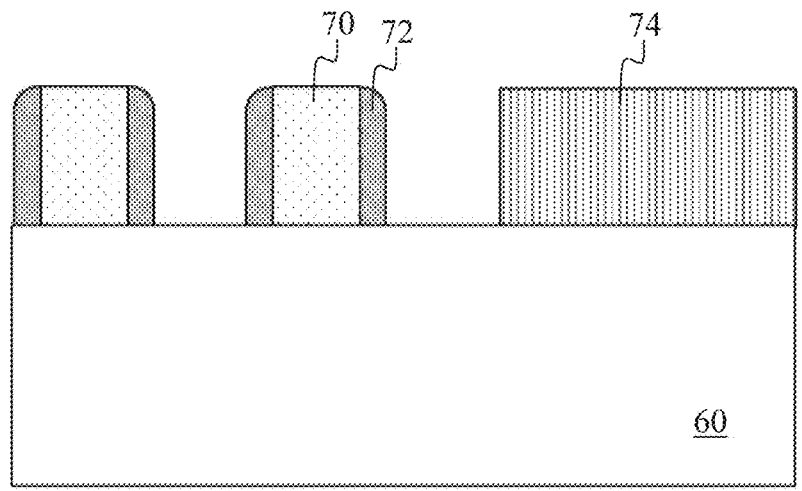

In FIG. 26, spacers 72 are formed around the mask elements 70. For example, a spacer material may be conformally deposited over the mask elements 70 and anisotropically etched. An exemplary spacer material is silicon nitride, though any suitable material may be used.

After formation of spacers 72, a mask 74 is deposited and patterned over the substrate 60. An exemplary mask 74 is formed from photoresist material. The mask 74 is patterned to define a planar active region 79 where fin structures are not formed.

Figure 27:
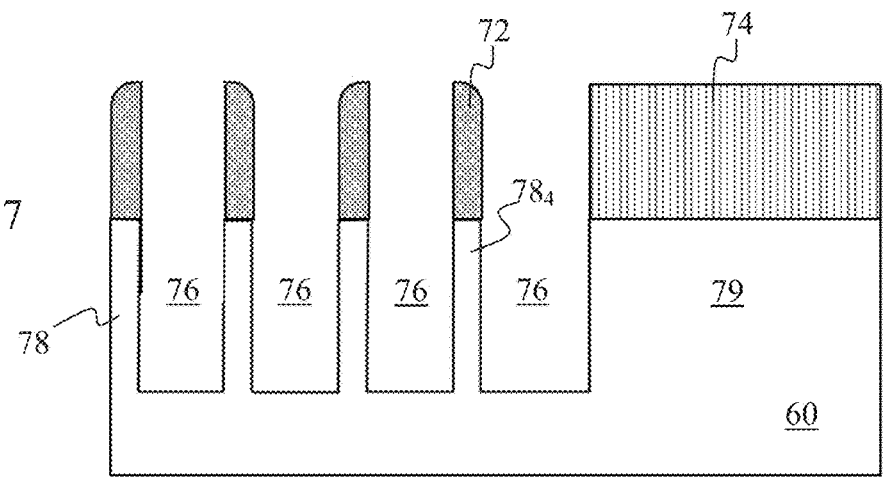

The method may continue in FIG. 27 with an etch process to remove the mask elements 70. Further, an etch process is performed to etch the substrate 60 to form trenches 76. The etch processes are selective to etching the mask elements 70 and substrate 60 over the spacers 72 and mask 74. As shown, fin structures 78 are defined by trenches 76.

Figure 28:
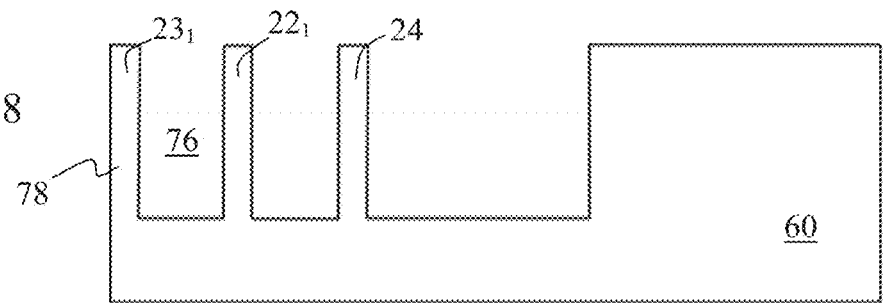

In FIG. 28, the spacers 72 and the mask 74 are removed. Then, a mask (not shown) is deposited and patterned over the substrate 60 to expose fin structure 78₄ (shown in FIG. 27). A fin etch is then performed to remove fin structure 78₄. Thereafter, the mask is removed. The remaining fin structures 78 may be identified as primary fin structure 22₁, adjacent fin structure 23₁, and adjacent fin structure 24

Figure 29:
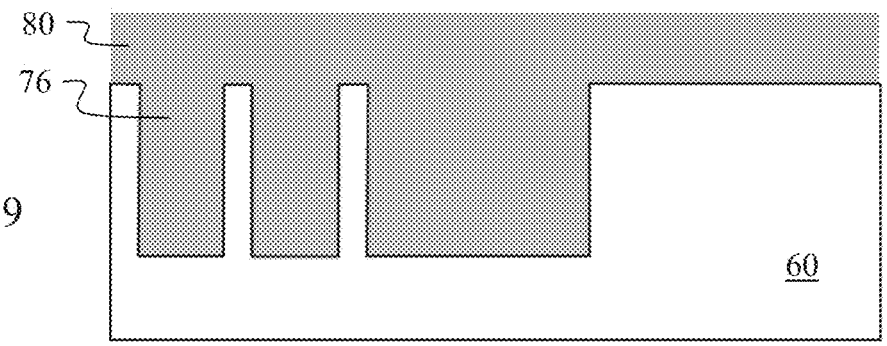
Figure 30:
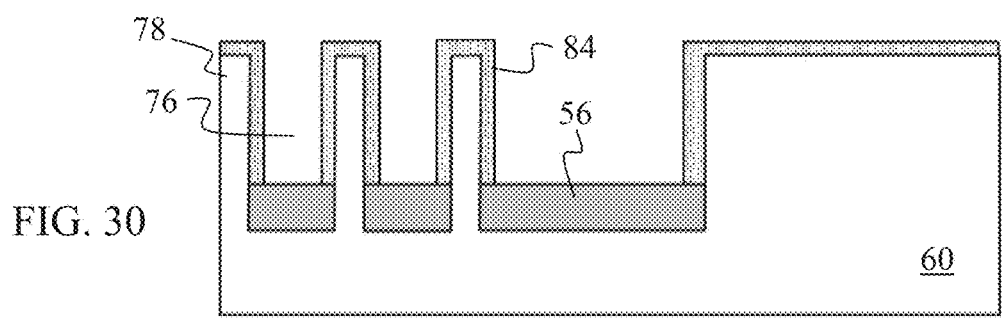

As shown in FIG. 29, a dielectric material 80 is deposited over the substrate 60, including filling trenches 76. After deposition, the dielectric material 80 may be planarized, such as by chemical mechanical planarization (CMP). An exemplary dielectric material 80 is silicon oxide, though any suitable dielectric material may be used. In FIG. 30, the dielectric material 80 is recessed within trenches 76 through an etch back process to form isolation regions 56 at the bottom of trenches 76. Then, a sacrificial liner 84 is formed on the surfaces of the fin structures 78. For example, a process selective deposition on silicon may be performed, such as a process for selectively forming silicon oxide.

Figure 31:
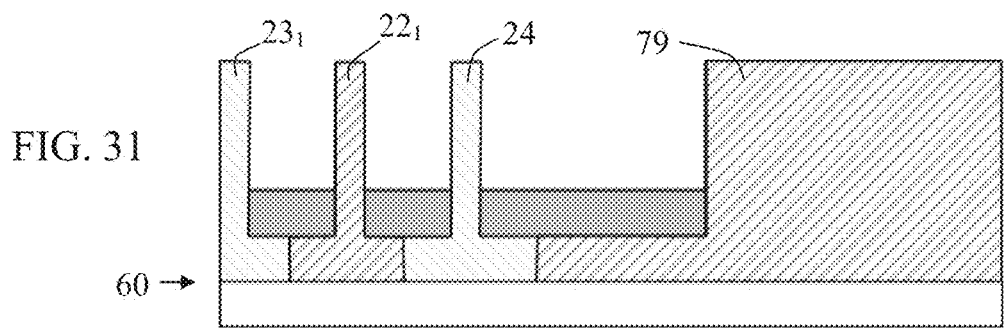
Figure 32:
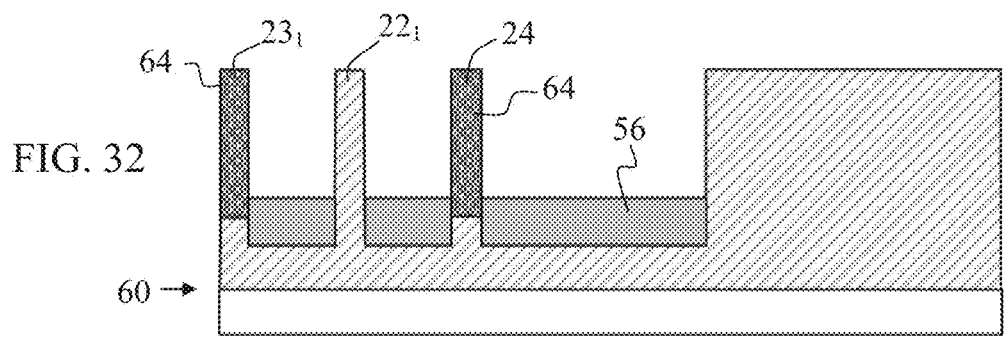

FIGS. 31 and 32 illustrate alternate processing of the structure of FIG. 30.

Specifically, FIG. 31 represents processing for forming a dual-bit NVM structure as shown in FIG. 4-10 or 18-25, while FIG. 32 represents processing for forming a dual-bit NVM structure as shown in FIGS. 11-17.

In FIG. 31, doping processes are performed to appropriately doped fin structures 22₁, 23₁ and 24. For example, in the embodiment of FIG. 31, primary fin structure 22₁ and planar active region 79 are P doped to form P wells, and the adjacent fin structures 23₁ and 24 are N doped to serve as a program/erase gate N wells. Then, the sacrificial liner 84 is removed.

In the alternate embodiment of FIG. 32, doping processes are performed to appropriately doped fin structures 22₁, 23₁ and 24. Specifically, the fin structures 22₁, 23₁ and 24 are all P doped to form a P well. Further, the portions of adjacent fin structures 23₁ and 24 that extend above isolation region 56 are heavily N doped (N+) to form junction regions 64. Then, the sacrificial liner 84 is removed.

Figure 33:
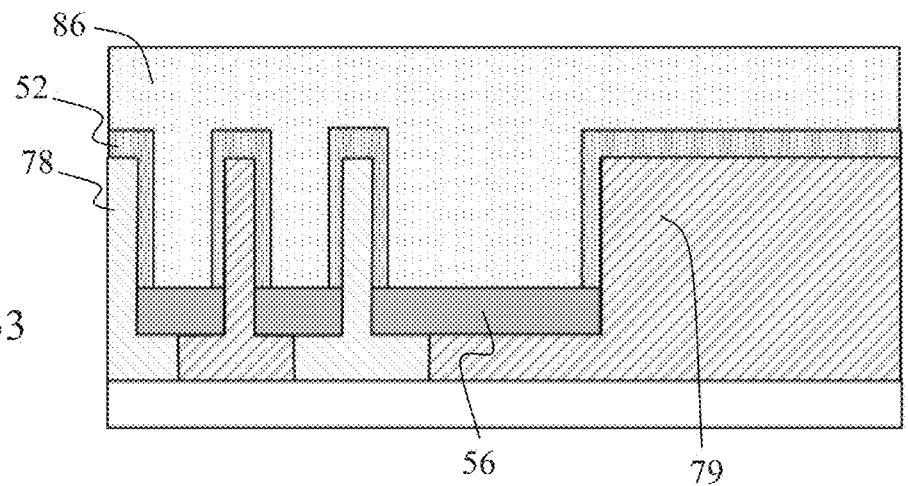

Processing in FIG. 33 utilizes the structure of FIG. 31; however, such processing may alternatively be performed on the structure of FIG. 32. In FIG. 33, dielectric layer 52 is formed around the fin structures 78. An exemplary dielectric layer 52 is formed from silicon oxide. In an exemplary embodiment, a selective process, such as thermal oxidation, forms silicon oxide dielectric layer 52 on the fin structures 78 an on planar active region 79. In an exemplary embodiment, the dielectric layer 52 is a thick oxide layer, such as a layer having a thickness of from about 60 Å to about 80 Å.

As further shown in FIG. 33, a gate material 86 is deposited over the dielectric layer 52 and isolation region 56. An exemplary gate material 86 is polysilicon, though other gate material, such as amorphous silicon or metals, may be used. In an exemplary embodiment, the gate material 86 is in situ N+ doped polysilicon.

Figure 34:
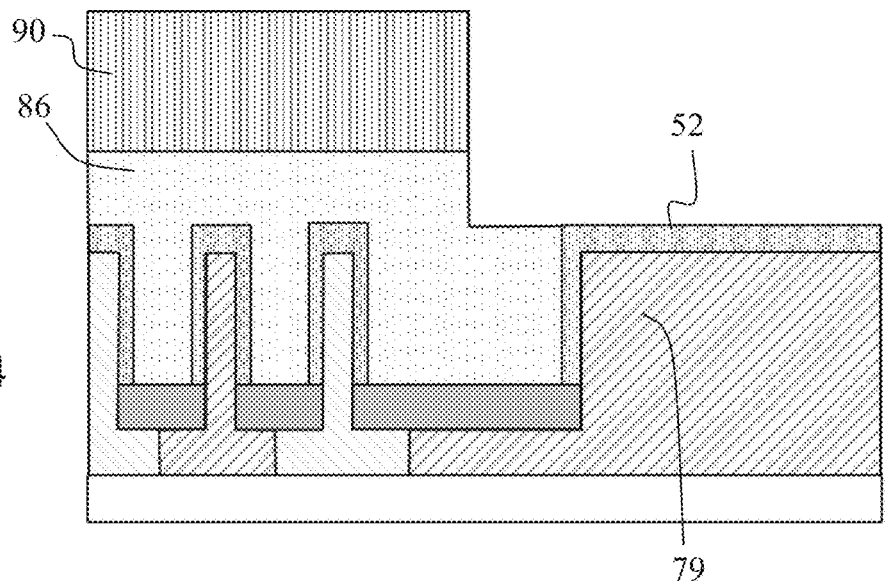

In FIG. 34, a masking material is deposited and patterned to form a mask 90 over the gate material 86. An exemplary masking material is photoresist. Patterning of the masking material is performed to define the length of the floating gate in the Y direction (into and out of the drawing sheet of FIG. 34). As shown, an etch process is performed to recess the portion of the gate material 86 not covered by mask 90 down to the dielectric layer 52 overlying the planar active region 79. The mask 90 may then be removed.

Figure 35:
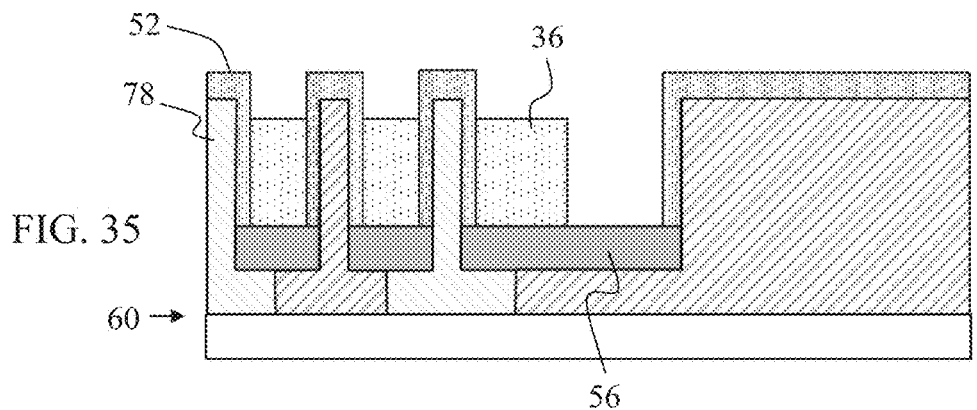

In FIG. 35, the gate material 86 is anisotropically etched lower the height of the gate material, such as to below the height of the fin structures 78. During the gate material etch of FIG. 35, the dielectric layer 52 and isolation region 56 prevent etching of the fin structures 78 or substrate 60. As a result of the etch process, floating gates 36 are formed adjacent each fin structure 78.

Figure 36:
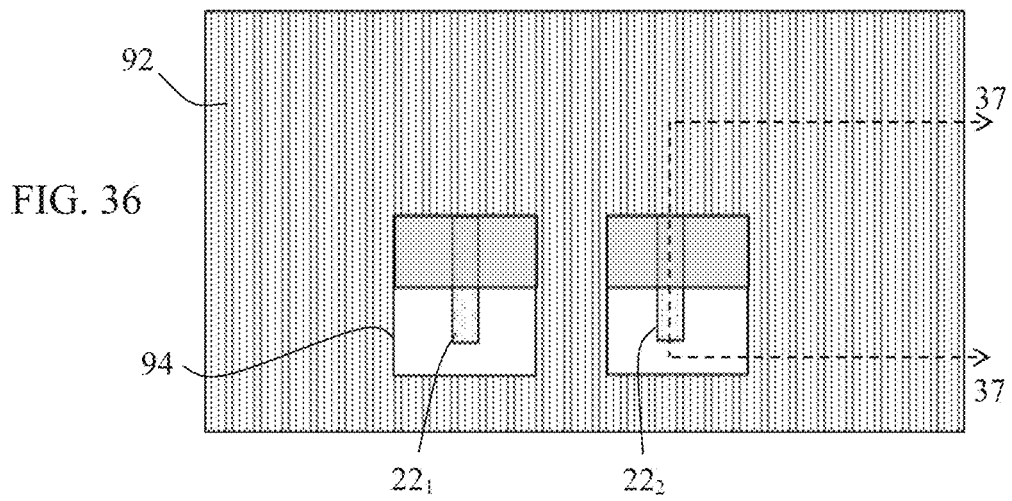
Figure 37:
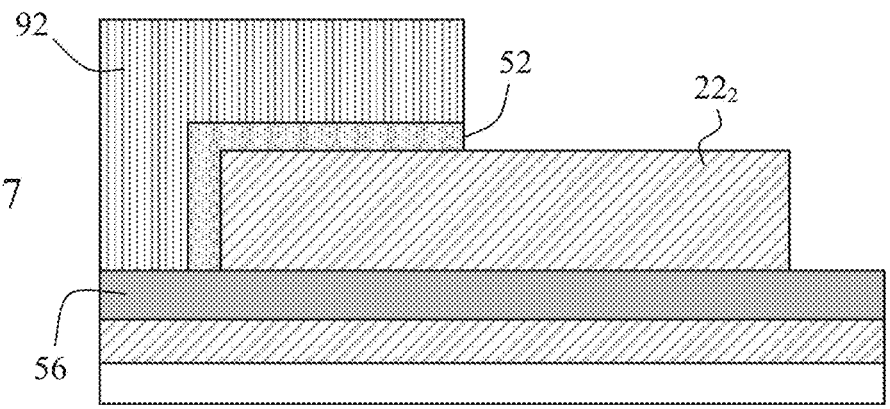
Figure 38:
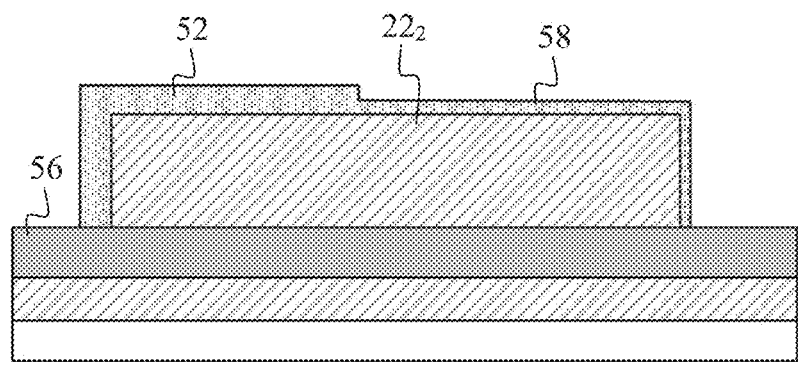
Figure 39:
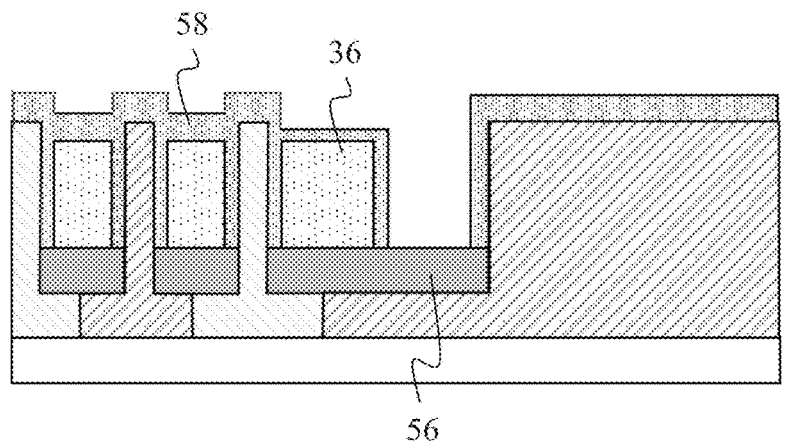

FIGS. 36-38 illustrate processing for removing dielectric layer 52 from fin structure 22. As shown in FIG. 36, a mask 92 is deposited and patterned to include openings 94 exposing ends of the fin structures 22. In FIG. 37, an etch is performed to remove the dielectric layer 52 exposed by opening 94. In FIG. 38, the mask 92 is removed and dielectric layer 58 is formed over the floating gates 36 and fin structure 22. In an exemplary embodiment, the dielectric layer 58 is formed as a thin silicon oxide layer, such as a layer having a thickness of from about 20 Å to about 40 Å. FIG. 39 illustrates the structure of FIG. 38 in a cross-section view similar to that of FIG. 35.

Figure 40:
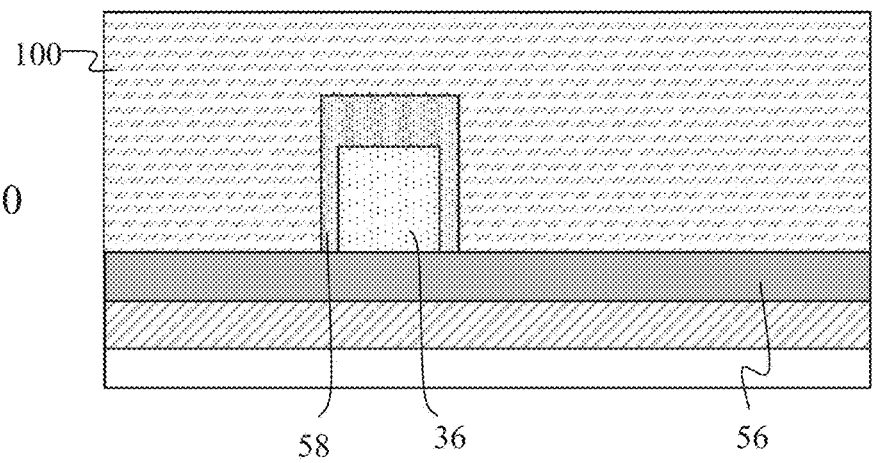

FIGS. 39-43 illustrate processing in accordance with the embodiments of FIGS. 4-10 and 11-17 for forming control gate 40 from a single common layer. FIG. 39 illustrates the structure of FIG. 38 in a cross-section view similar to that of FIG. 35 while FIG. 40 provides a cross-section view of the structure of FIG. 38 along a line such as line 7-7 in FIG. 4.

As shown in FIG. 40, a gate material 100 is deposited over the dielectric layer 58 overlying the floating gate 36 and over the isolation region 56. An exemplary gate material 100 is polysilicon, though any suitable gate material may be used.

Figure 41:
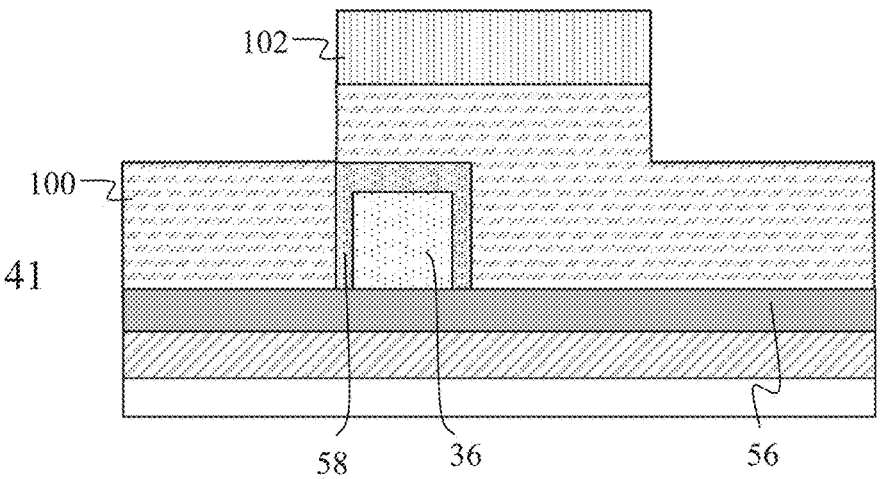
Figure 42:
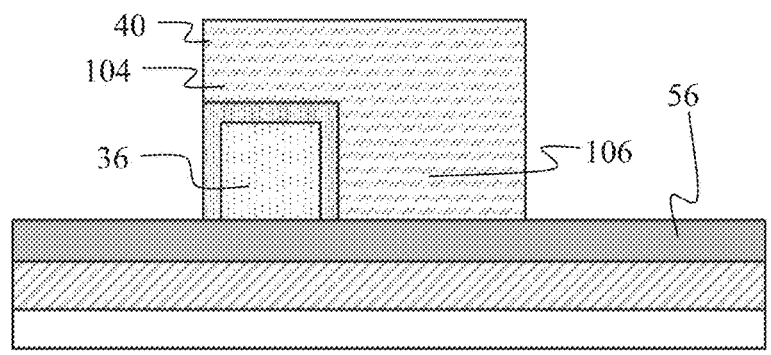
Figure 43:
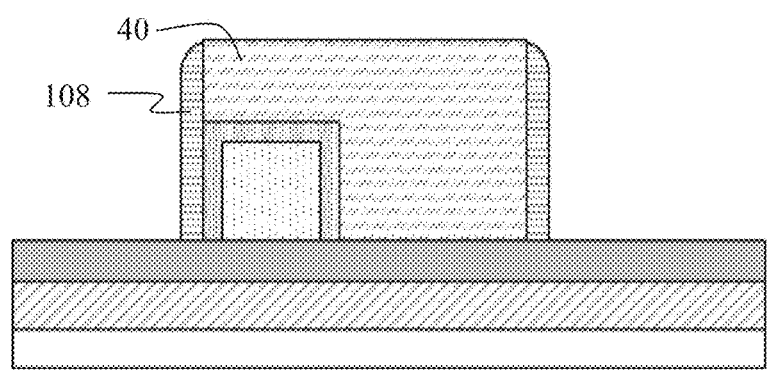

FIGS. 41-43 provide the same cross-section view as FIG. 40. In FIG. 41, a mask 102 is deposited and pattered over the gate material 100. The mask 102 is utilized to define the control gate length in the X direction. Further, an etch process is performed to recess the gate material 100, such as to the height of the floating gate 36 (and dielectric layer 58). In FIG. 42, an anisotropic etch process may be performed to define control gate 40 and the mask 102 is removed, as shown. The exemplary control gate 40 is formed with an upper portion 104 overlying the floating gate 36 and a lower portion 106 on the isolation region 56 and beside and not over the floating gate 36.

As shown in FIG. 43, spacers 108 are formed around the control gate 40. Exemplary spacers 108 are formed from silicon nitride, or another suitable material. In an exemplary embodiment, spacer material is conformally deposited and anisotropically etched to form spacers 108.

Figure 44:
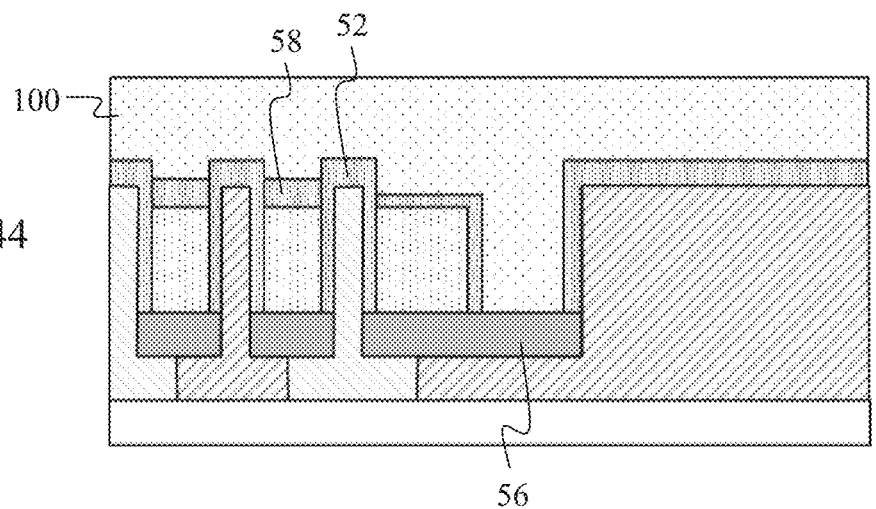
Figure 45:
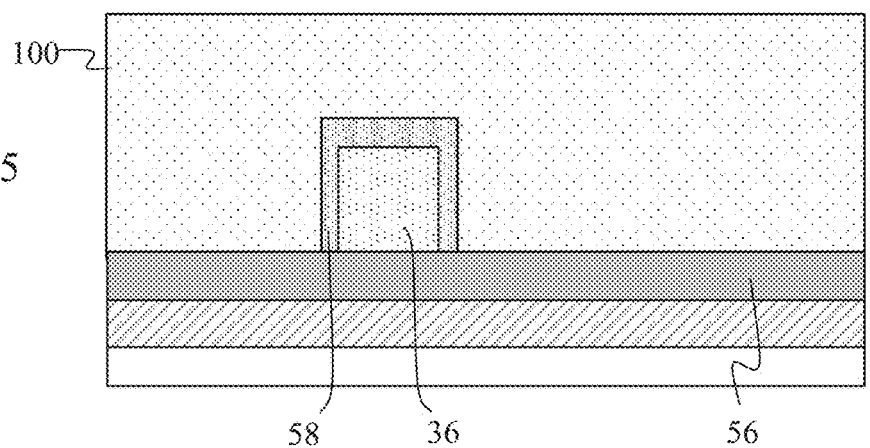

FIGS. 44-48 illustrate processing in accordance with the embodiments of FIGS. 18-24 for forming control gate 40 with discrete portions. FIG. 44 illustrates the structure of FIG. 38 in a cross-section view similar to that of FIG. 35 while FIG. 45 provides a cross-section view of the structure of FIG. 38 along a line such as line 21-21 in FIG. 18. As shown in FIGS. 44 and 45, a gate material 100 is deposited over the dielectric layer 58 overlying the floating gate 36 and over the isolation region 56. An exemplary gate material 100 is in situ N+ doped polysilicon, though any suitable gate material may be used.

Figure 46:
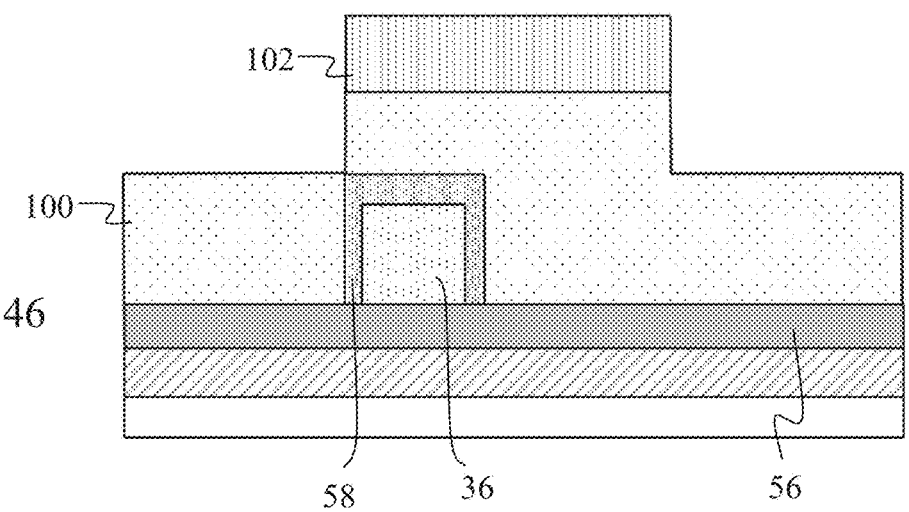
Figure 47:
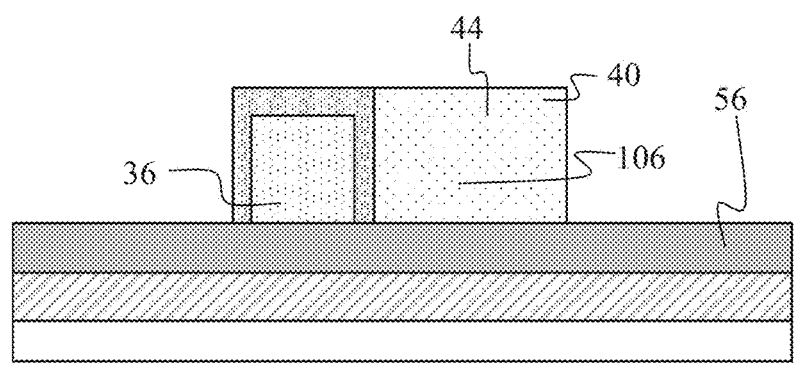
Figure 48:
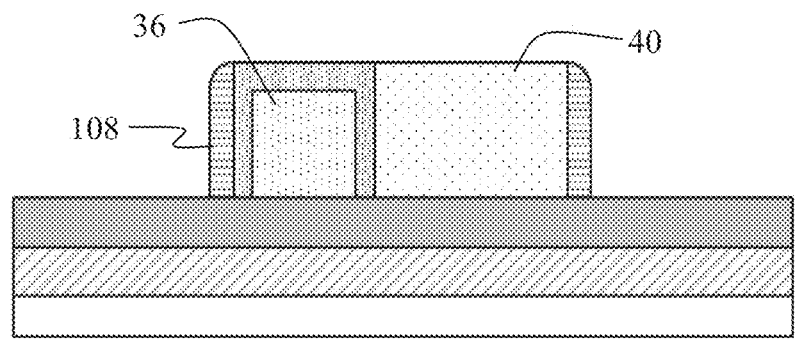

FIGS. 46-48 provide the same cross-section view as FIG. 45. In FIG. 46, a mask 102 is deposited and pattered over the gate material 100. The mask 102 is utilized to define the control gate length in the X direction. Further, an etch process is performed to recess the gate material 100, such as to the height of the floating gate 36 (and dielectric layer 58).

In FIG. 47, the mask 102 is removed, and an anisotropic etch process may be performed to define control gate 40, as shown. The exemplary control gate 40 is formed with a height no greater than the height of the floating gate 36 (and dielectric layer 58). Control gate 40 includes a control gate portion 44 or lower portion 106 on the isolation region 56 and beside and not over the floating gate 36.

As shown in FIG. 48, spacers 108 are formed around the control gate 40 and floating gate 36. Exemplary spacers 108 are formed from silicon nitride, or another suitable material. In an exemplary embodiment, spacer material is conformally deposited and anisotropically etched to form spacers 108.

Figure 49:
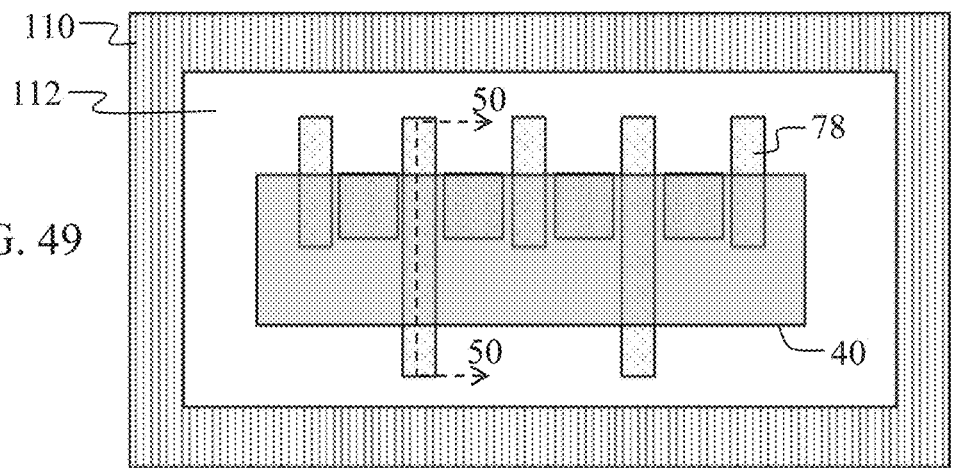
Figure 50:
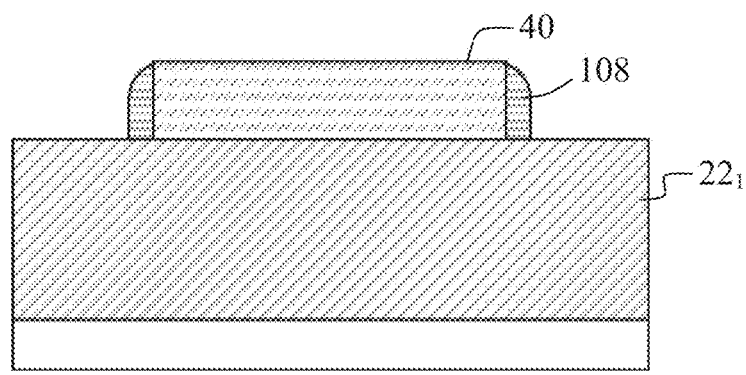
Figure 51:
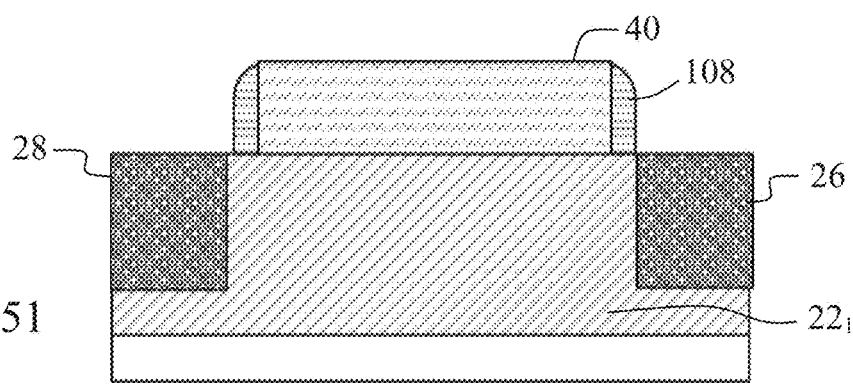

FIGS. 49-51 illustrate further processing of the structure of FIG. 44 and the embodiments of FIGS. 4-10 and 11-17 to form the junction regions 26 and 28. FIG. 49 is an overhead schematic that illustrates the deposition and patterning of a masking material to form a mask 110 with an opening 112. As shown, control gate 40 and spacers 108 (shown in FIGS. 50-51) cover the underlying floating gates 36 and centrally located portions of the fin structures 78.

FIG. 50 is a cross-section view taken along line 50-50 in FIG. 49. As shown, a portion of the control gate 40, and the surrounding spacers 108, lie over the primary fin structure $22_1$.

In FIG. 51, a doping process may be performed on the structure of FIG. 50. The mask 110, control gate 40 and spacers 108 block dopants during the doping process. As a result, junction regions 26 and 28 are formed in the fin structure $22_1$ in alignment with control gate 40 and spacers 108. During the same doping process, junction regions 26 and 28 are formed in primary fin structure $22_2$ (shown in FIGS. 4 and 5) and junction regions 34 are formed in adjacent fin structures $23_1$, $23_1$, and 24 (shown in FIGS. 4 and 6). In an exemplary embodiment, a heavy N doping process is performed such that junction regions 26, 28 and 34 are heavily N doped (N+ doped).

Figure 52:
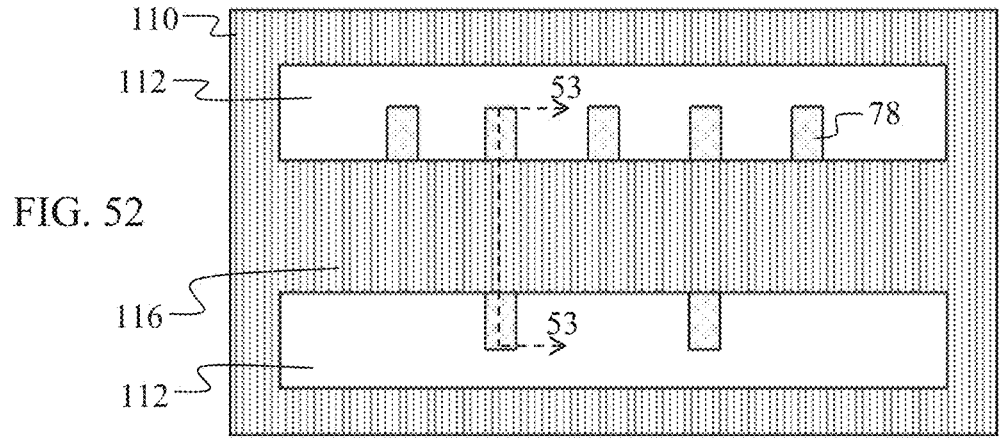
Figure 53:
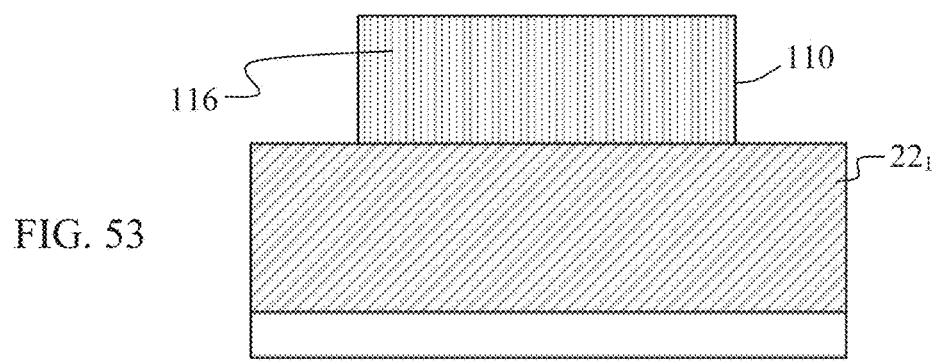
Figure 54:
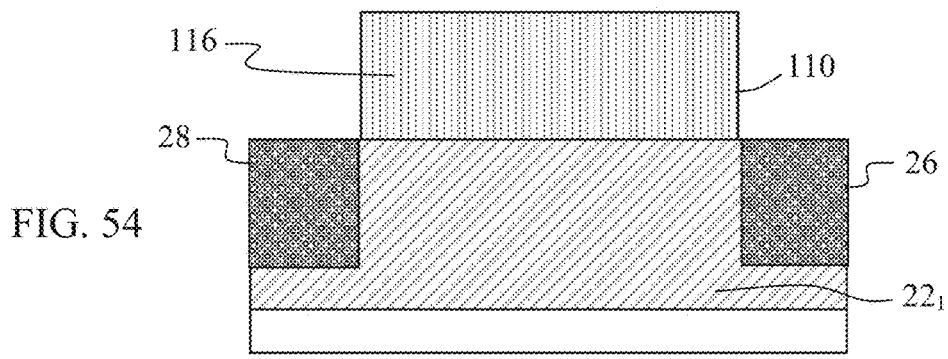

FIGS. 52-54 illustrate further processing of the structure of FIG. 48 and the embodiment of FIGS. 18-24 to form the junction regions 26 and 28. FIG. 52 is an overhead schematic that illustrates the deposition and patterning of a masking material to form a mask 110 with an opening 112. Unlike the embodiment of FIGS. 49-51, the control gate 40 in the embodiment of FIGS. 48 and 52-54 does not extend over the fin structures 78. Therefore, in FIG. 52, mask 110 includes a central portion 116 extending over the centrally located portions of the fin structures 78.

FIG. 53 is a cross-section view taken along line 53-53 in FIG. 52. As shown, the central portion 116 of mask 110 lies over the primary fin structure $22_1$. In FIG. 54, a doping process may be performed on the structure of FIG. 53. The mask 110, including central portion 116, blocks dopants during the doping process. As a result, junction regions 26 and 28 are formed in the fin structure $22_1$ in alignment with the central portion 116 of the mask 110. During the same doping process, junction regions 26 and 28 are formed in primary fin structure $22_2$ (shown in FIGS. 4 and 5) and junction regions 34 are formed in adjacent fin structures $23_1$, $23_1$, and 24 (shown in FIGS. 4 and 6). In an exemplary embodiment, a heavy N doping process is performed such that junction regions 26, 28 and 34 are heavily N doped (N+ doped). Thereafter, the mask 110 may be removed.

The various processing techniques described in FIGS. 25-54 may be utilized to form a fin-based dual-bit NVM structure 20 as described in embodiments of FIG. 4-10, 11-17 or 18-24, or as having a combination of elements from the embodiments of FIG. 4-10, 11-17 or 18-24. Further, while doping types of certain elements are described herein, it is contemplated that opposite doping types may be used.

As described, an exemplary fin-based dual-bit NVM structure 20 utilizes three fin structures, including a primary fin structure with drain, channel and source regions, and two adjacent fin structures with junction regions for connection to program probes and/or erase probes. A select gate is located on each side of the primary fin structure. Further, a control gate is located adjacent to each side of the primary fin structure. The control gate may be formed as a common control gate layer or as discrete control gate portions.

Methods provided herein form fin-based dual-bit NVM structures within the processing flow of finFET technology. Further, the methods provided herein, when incorporated with CMOS logic device fabrication, provide for uniform gate stack height between the NVM structures and CMOS logic structures. Also, the self-alignment of floating gates with fin structures allows high density of elements in the Y direction without the need for challenging lithography processing.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising:
   a substrate; and
   a dual-bit nonvolatile memory (NVM) structure overlying the substrate and including:
   a primary fin structure, a first adjacent fin structure and a second adjacent fin structure laterally extending in parallel over the substrate, wherein the primary fin structure includes a source region, a channel region, and a drain region, wherein the first adjacent fin structure includes a first program/erase gate, and wherein the second adjacent fin structure includes a second program/erase gate;
   a first floating gate located between the channel region of the primary fin structure and the first adjacent fin structure;
   a second floating gate located between the channel region of the primary fin structure and the second adjacent fin structure; and
   a control gate adjacent the primary fin structure.

2. The integrated circuit of claim 1 wherein the primary fin structure is located between the first adjacent fin structure and the second adjacent fin structure.

3. The integrated circuit of claim 1 wherein the control gate includes a first control gate adjacent the first floating gate and a second control gate adjacent the second floating gate.

4. The integrated circuit of claim 1 wherein the control gate includes a control gate layer between the primary fin structure and the first adjacent fin structure, between the primary fin structure and the second adjacent fin structure, and overlying the primary fin structure, the first adjacent fin structure, and the second adjacent fin structure.

5. The integrated circuit of claim 1 wherein the dual-bit NVM structure includes a first isolation region located between the primary fin structure and the first adjacent fin structure and a second isolation region located between the primary fin structure and the second adjacent fin structure, wherein the first floating gate and the control gate are located over the first isolation region, and wherein the second floating gate and the control gate are located over the second isolation region.

6. The integrated circuit of claim 1 wherein:
   the primary fin structure is doped with a first dopant type; and
   the first adjacent fin structure and the second adjacent fin structure are doped with a second dopant type.

7. The integrated circuit of claim 6 wherein:
   the primary fin structure is P doped; and
   the first adjacent fin structure and the second adjacent fin structure are N doped.

8. The integrated circuit of claim 1 wherein the primary fin structure, the first adjacent fin structure and the second adjacent fin structure are doped with a first dopant type.

9. The integrated circuit of claim 1 wherein the dual-bit NVM structure is a first dual-bit NVM structure, and wherein the integrated circuit further comprises a second dual-bit NVM structure overlying the substrate and including:
   the second adjacent fin structure, a second primary fin structure and a third adjacent fin structure laterally extending over the substrate and in parallel to the second adjacent fin structure, wherein the second primary fin structure includes a second source region, a second channel region, and a second drain region, and wherein the third adjacent fin structure includes a third program/erase gate; and
   a third floating gate located between the second channel region of the second primary fin structure and the third adjacent fin structure; wherein the second floating gate is located between the channel region of the second primary fin structure and the second adjacent fin structure, and wherein the control gate is adjacent the second primary fin structure.

10. A nonvolatile memory (NVM) structure comprising:
    a primary fin structure having a first side surface and a second side surface;
    an adjacent fin structure parallel to the primary fin structure and adjacent the first side surface;
    a first junction region and a second junction region in the primary fin structure;
    a first channel region at the first side surface between the first junction region and the second junction region;
    a third junction region in the adjacent fin structure;
    a floating gate adjacent the first channel region, wherein no portion of the floating gate lies directly over the primary fin structure; and
    a control gate adjacent the floating gate.

11. The NVM structure of claim 10, wherein:
    the NVM structure is a dual-bit NVM structure;
    the adjacent fin structure is a first adjacent fin structure;
    the floating gate is a first floating gate adjacent the first channel region; and
    the NVM structure further comprises:
    a second adjacent fin structure parallel to the primary fin structure and adjacent the second side surface of the primary fin structure;
    a second channel region at the second side surface between the first junction region and the second junction region;
    a fourth junction region in the second adjacent fin structure; and
    a second floating gate adjacent the second channel region, wherein the control gate is adjacent the first floating gate and the second floating gate, and wherein no portion of the second floating gate lies directly over the primary fin structure.

12. The NVM structure of claim 10 wherein the control gate includes a control gate layer between the primary fin structure and the adjacent fin structure, and overlying the primary fin structure and the adjacent fin structure.

13. The NVM structure of claim 10 further comprising an isolation region located between the primary fin structure and the adjacent fin structure, wherein the floating gate and the control gate are located over the isolation region, wherein the floating gate terminates at an uppermost surface at a first height over the isolation region, and wherein the primary fin structure terminates at a second height over the isolation region greater than the first height.

14. The NVM structure of claim 10 wherein:
    the primary fin structure is doped with a first dopant type; and
    the adjacent fin structure is doped with a second dopant type.

15. The NVM structure of claim 14 wherein:
    the primary fin structure is P doped; and
    the adjacent fin structure is N doped.

16. The NVM structure of claim 10 wherein the primary fin structure and the adjacent fin structure are doped with a first dopant type.

17. A nonvolatile memory (NVM) structure comprising:
a primary fin structure having a first side surface and a second side surface;
an adjacent fin structure parallel to the primary fin structure and adjacent the first side surface;
a first junction region and a second junction region in the primary fin structure;
a first channel region at the first side surface between the first junction region and the second junction region;
a third junction region in the adjacent fin structure;
a floating gate adjacent the first channel region; and
a control gate adjacent the floating gate, wherein no portion of the control gate lies directly over the floating gate.

18. The NVM structure of claim 17 wherein the primary fin structure and the adjacent fin structure are doped with a first dopant type.

19. The NVM structure of claim 17 further comprising an isolation region located between the primary fin structure and the adjacent fin structure, wherein the floating gate and the control gate are located over the isolation region.

20. The NVM structure of claim 17, wherein:
the NVM structure is a dual-bit NVM structure;
the adjacent fin structure is a first adjacent fin structure;
the floating gate is a first floating gate adjacent the first channel region;
the control gate is a first control gate portion adjacent the first floating gate; and
the NVM structure further comprises:
a second adjacent fin structure parallel to the primary fin structure and adjacent the second side surface of the primary fin structure;
a second channel region at the second side surface between the first junction region and the second junction region;
a fourth junction region in the second adjacent fin structure;
a second control gate portion adjacent the second floating gate; and
a second floating gate adjacent the second channel region, wherein the control gate is adjacent the first floating gate and the second floating gate.

* * * * *